US006541814B1

(12) United States Patent
Cao et al.

(10) Patent No.: US 6,541,814 B1
(45) Date of Patent: Apr. 1, 2003

(54) MOS VARIABLE CAPACITOR WITH CONTROLLED DC/DV AND VOLTAGE DROP ACROSS W OF GATE

(75) Inventors: Min Cao, Mountain View, CA (US); Hide Hattori, Palo Alto, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/682,993

(22) Filed: Nov. 6, 2001

(51) Int. Cl.[7] .................. H01L 27/108; H01L 29/76; H01L 29/94; H01L 31/119; H01L 29/00; H01L 29/93
(52) U.S. Cl. .................. 257/312; 257/312; 257/313; 257/532; 257/595; 257/598
(58) Field of Search .................. 257/601, 598, 257/313, 312, 532, 595

(56) References Cited

U.S. PATENT DOCUMENTS

| 3,812,517 | A |   | 5/1974  | Sato et al. ............ 357/23    |
|-----------|---|---|---------|-----------------------------------|
| 4,021,788 | A |   | 5/1977  | Marr ................. 340/173     |
| 4,499,387 | A |   | 2/1985  | Konishi ............. 307/443      |
| 4,642,580 | A |   | 2/1987  | Scott ................ 331/117     |
| 4,843,358 | A | * | 6/1989  | Meise et al. ......... 333/263     |
| 5,055,889 | A |   | 10/1991 | Beall ................ 357/14      |
| 5,173,835 | A |   | 12/1992 | Cornett et al. ....... 257/310     |
| 5,220,194 | A |   | 6/1993  | Golio et al. ......... 257/601     |
| 5,248,948 | A |   | 9/1993  | Shiga ................ 331/96      |
| 5,600,187 | A |   | 2/1997  | El-Hamamsy et al. .... 307/157     |
| 5,747,865 | A |   | 5/1998  | Kim et al. ........... 257/480     |
| 5,965,912 | A |   | 10/1999 | Stolfa et al. ........ 257/312     |
| 6,172,378 | B1 |  | 1/2001  | Hull et al. .......... 257/14      |
| 6,211,745 | B1 |  | 4/2001  | Mucke et al. ......... 331/117     |
| 6,242,989 | B1 |  | 6/2001  | Barber et al. ........ 331/177     |
| 6,268,779 | B1 |  | 7/2001  | van Zeijl ............ 331/117     |
| 6,400,001 | B1 | * | 6/2002  | Manzini et al. ....... 257/601     |

* cited by examiner

Primary Examiner—Nathan J. Flynn
Assistant Examiner—Victor A. Mandala, Jr.
(74) Attorney, Agent, or Firm—Stuart T. Auvinen

(57) ABSTRACT

A voltage-variable capacitor is constructed from a metal-oxide-semiconductor transistor. The transistor source has at least two contacts that are biased to different voltages. The source acts as a resistor with current flowing from an upper source contact to a lower source contact. The gate-to-source voltage varies as a function of the position along the source-gate edge. A critical voltage is where the gate-to-source voltage is equal to the transistor threshold. A portion of the source has source voltages above the critical voltage and no conducting channel forms under the gate. Another portion of the source has source voltages below the critical voltage, and thus a conducting channel forms under the gate for this portion of the capacitor. By varying either the gate voltage or the source voltages, the area of the gate that has a channel under it is varied, varying the capacitance. Separate source islands eliminate source current.

20 Claims, 8 Drawing Sheets

MOS VARIABLE CAPACITOR WITH CONTROLLED DC/DV AND VOLTAGE DROP ACROSS W OF GATE

BACKGROUND OF INVENTION

This invention relates to integrated circuit capacitors, and more particularly to voltage-variable integrated capacitors.

Variable capacitors or varactors have been used for many years in tuning circuits. For example, radio receivers once used variable capacitors that adjusted a band-pass frequency in a tuning circuit, allowing one radio station to be amplified while suppressing other radio frequency signals. The amount of capacitance was varied by a user turning a dial that rotated half of the metal plates of the capacitor. As the user rotated the plates, the overlap area between adjacent metal plates varied, thus varying the capacitance value. FIG. 1 shows a symbol for a variable capacitor or varactor.

More recently, capacitors have been integrated onto larger integrated circuit (IC) chips. Often a capacitor is formed from a metal-oxide-semiconductor (MOS) field-effect transistor. FIG. 2 shows a prior-art MOS capacitor. The source and drain terminals of the MOS transistor are shorted together and form one terminal ND of the capacitor, with the MOS transistor's gate forms the second capacitor terminal NG. The very thin gate oxide provides a large capacitance value in a small area.

The capacitance can be varied by changing the size of the MOS transistor. The circuit designer can select the desired capacitance by selecting the W and L values of the capacitor-transistor. However, once the circuit is manufactured, the capacitance is fixed.

A variable capacitor can be made by including several capacitors in parallel on the IC chip. An array of switches or pass transistors can selectively couple the parallel capacitors to a circuit node. Electronic signals can be applied to the gates of some of the pass transistors to electronically connect the selected capacitors to the circuit node. Other electronic signals can turn off other pass transistors, disconnecting their capacitors from the circuit node. As more of the parallel capacitors are connected to the circuit node, the capacitance increases. Thus the total capacitance attached to the circuit node can be electronically selected. The electronic signals can be coded binary signals such as a thermometer code.

While such a binary-controlled variable capacitor is useful, an analog-voltage controlled variable capacitor is desired. A variable capacitor that changes its capacitance value based on an applied voltage can allow for a wider range of capacitances, rather than a limited quanta of capacitances selected by binary control signals. What is desired is a voltage-variable capacitor that can be integrated with circuits using common MOS processes.

DETAILED DESCRIPTION

The present invention relates to an improvement in voltage-variable capacitors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Source/Drain Acts as Resistor

Figure 1:
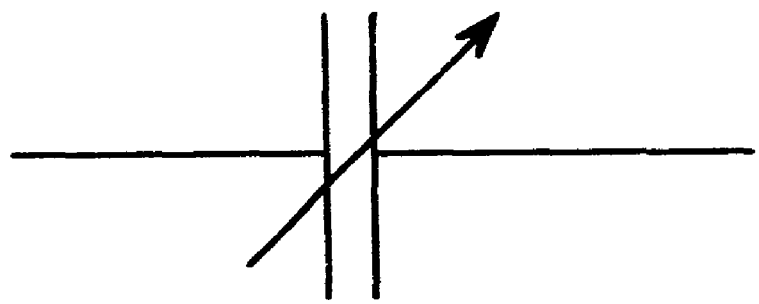
FIG. 1 shows a symbol for a variable capacitor or varactor.
Figure 2:
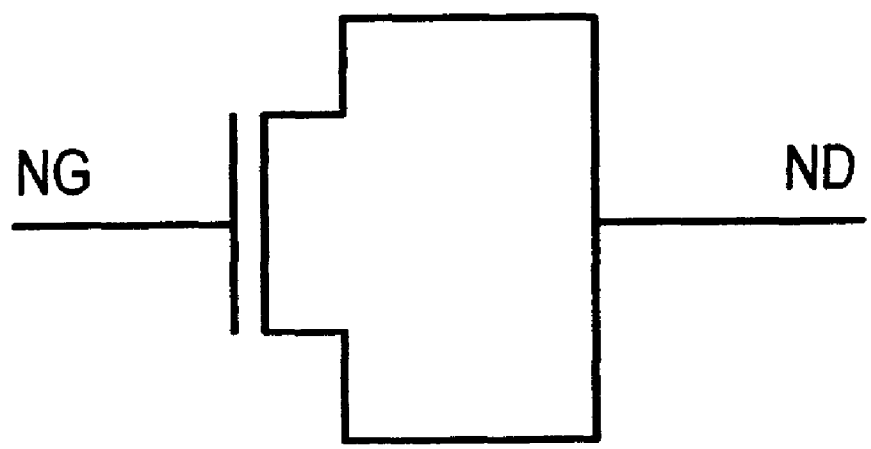
FIG. 2 shows a prior-art MOS capacitor.
Figure 3:
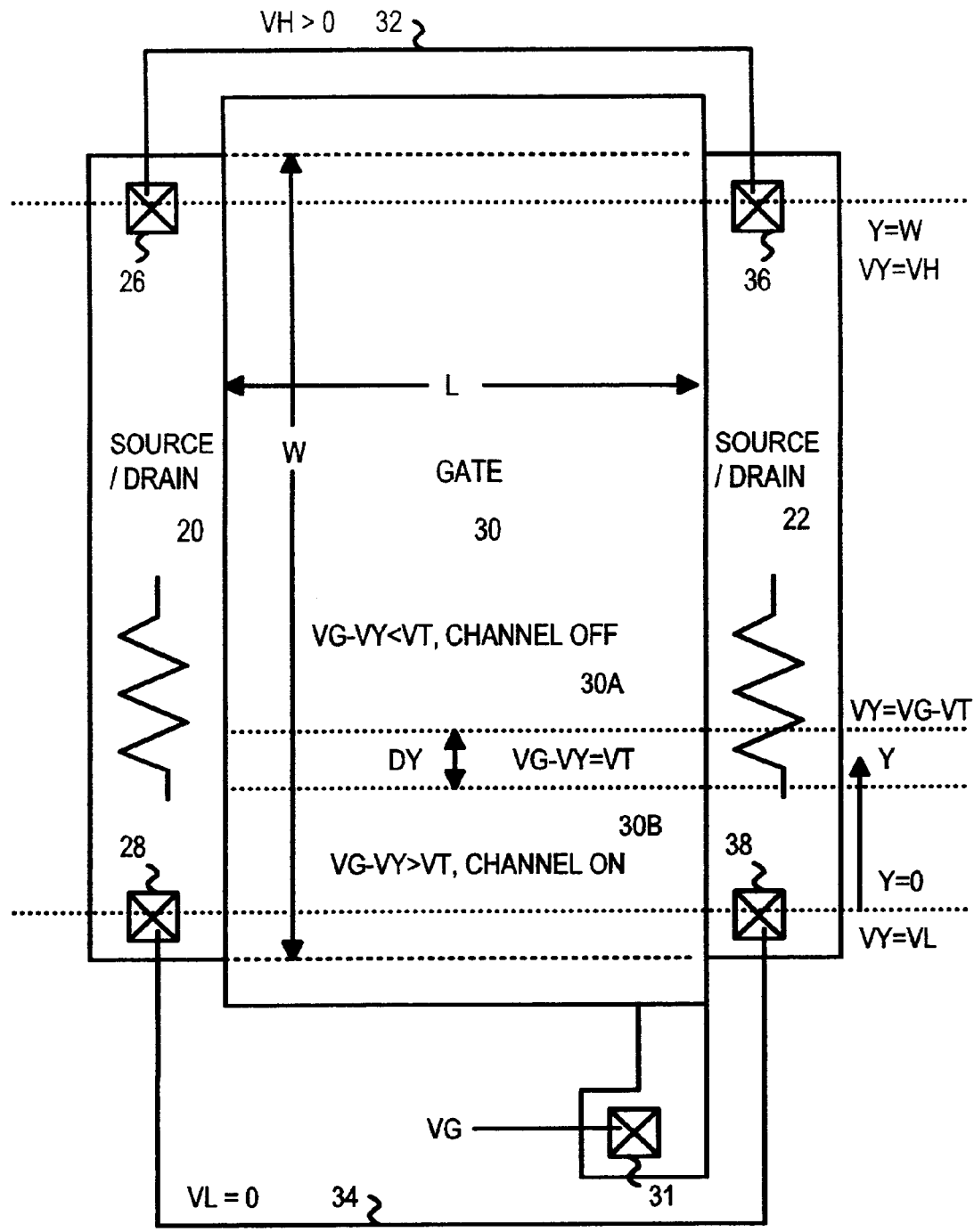
FIG. 3 shows a voltage-variable capacitor with a voltage drop along the source and a voltage drop along the drain.

FIG. 3 shows a voltage-variable capacitor with a voltage drop along the source and a voltage drop along the drain. A capacitor is formed between the gate and channel under the gate of a MOS transistor. An n-channel transistor is used, although a p-channel transistor could be substituted with appropriate bias and threshold voltage changes.

Gate 30 is formed from polysilicon or other transistor-gate material and is biased by voltage VG through gate contact 31, which is ordinarily formed on a connecting tab over a thick-oxide area some distance from the thin-oxide gate region. Since gate 30 is isolated from source 20 and drain 22 by the gate oxide and lateral oxides, no D.C. current flows through gate 30, although charging and discharging currents can flow intermittently.

Source 20 and drain 22 are often formed by a highly doped ion implant into the silicon or other substrate. Conducting regions are formed by the ion implant. The source/drain regions have a resistance of about 20–200 Ohms per square, although the exact value depends on the process used. A square is a square area where the length of the square is equal to the side of the source/drain region perpendicular to the gate edge. For example, a source that is 10 by 50 microns is 5 squares long. Usually only the source region between contacts is considered for resistance calculations, not the ends of the source.

Usually many contacts are placed along the entire gate-width (W) of source 20 and drain 22 for large transistors. This is done to minimize the parasitic resistance of the source and drain. However, only two contacts are placed in source 20. Upper contact 26 is placed at the upper end of source 20, while lower contact 28 is placed at the lower end of source 20. The region between contacts 26, 28 in FIG. 3 is about five squares. Since each square has a resistance of 20 ohms, the total resistance from contact 26 to contact 28 is about 100 ohms.

In addition to functioning as the transistor source, source 20 also forms a 100-ohm resistor between upper contact 26 and lower contact 28. Likewise, drain 22 acts as the transistor drain and as a 100-ohm resistor between its upper contact 36 and its lower contact 38.

Voltage Drop Across Source Resistor

Traditionally, the same voltage is applied to all contacts on a source/drain. Instead, the inventors apply different voltages to the ends of source 20. An upper voltage VH is applied to upper contacts 26, 36, while a lower voltage VL is applied to contacts 28, 38. Upper contacts 26, 36 connect to metal line 32, which is biased to voltage VH by a bias circuit (not shown). Lower contacts 28, 38 connect to another metal line 34, which is grounded. Voltage VH is above ground in this example.

A voltage gradient or differential of VH–VL is thus applied across source 20. This voltage differential of VH–VL is also applied across drain 22. A current flows from line 32 to line 34 through the resistor of source 20, and through the resistor of drain 22.

The size of the transistor is defined by the width W and length L of gate 30. The channel length L is the direction of current flow under gate 30, while the width W is the direction perpendicular to current flow in a normal transistor.

The total available capacitance of gate 30 is $L*W*\epsilon_{OX}/t_{OX}$, where $\epsilon_{OX}$ is the permitivity of the gate oxide and $t_{OX}$ is the oxide thickness. However, when the transistor is biased in an off condition, no conducting channel forms in the substrate under gate 30, and the capacitance is near zero, being only the parasitic and fringe capacitances. Also, when the transistor is biased in the saturated region, capacitance is limited because the channel is pinched off near the drain. The full capacitance is available when the transistor is biased in the linear region.

Source Voltage Varies Along W Direction

However, when a voltage difference is applied across the source 20, the voltage under gate 30 is not constant. Instead, the voltage under gate 30 varies as a function of distance between contacts 26, 28. For portions of gate 30 that are near upper contact 26, the source voltage is near VH. Portions of gate 30 near lower contact 28 have source voltages near VL. The middle of gate 30, halfway between contacts 26, 28 has a source voltage halfway between VH and VL, such as (VH–VL)/2 when the transistor is off. The drain voltage likewise varies as a function of distance between drain contacts 36, 38.

Since the source voltage varies along the W direction of gate 30, the gate-to-source voltage Vgs also varies along the W direction. For certain biasing conditions, the gate-to-source voltage can be above the threshold near lower contact 28, but below the threshold near upper contact 26. The upper portion 30A of gate 30 near upper contact 26 is turned off, since the gate-to-source voltage is below the threshold required to turn on the conducting channel under gate 30 (VG–VS(Y)=Vgs<Vth).

However, the lower portion or region 30B of gate 30 near lower contact 28 is turned on, since the gate-to-source voltage is above the threshold required to turn on the conducting channel in the substrate under gate 30 (VG–VS(Y)=Vgs>Vth). Where VG–VS(Y) is exactly equal to threshold Vth, the channel just starts to form. This is shown as region DY between upper region 30A (transistor off) and lower region 30B (transistor on).

The variable Y is the distance from lower contact 28. Y is 0 near lower contact 28, but is W near upper contact 26. (This simplified analysis ignores the portions of gate 30 and source 20 above upper contact 26 and below lower contact 28.) The total capacitance can be determined by integrating the capacitance along the Y (W) direction. The approximate capacitance is the gate capacitance of lower region 30B, which is $L*YT*\epsilon_{OX}/t_{OX}$, where YT is Y where VS(Y)–VG=Vth, $\epsilon_{OX}$ is the oxide permitivity and $t_{OX}$ is the oxide thickness.

Capacitance Varies with Applied Voltage

The capacitance can be varied by adjusting the biasing conditions. The gate voltage VG can be raised to make more values of Y have gate-to-source voltages over the threshold, thus increasing the area of turned-on lower region 30B. Reducing gate voltage VG moves the threshold point DY lower, reducing the area of turned-on lower region 30B and thus lowering capacitance. Thus the capacitance varies with gate voltage VG. Since the capacitance varies with gate voltage VG, the device is a voltage-variable capacitor, or varactor.

Figure 4A:
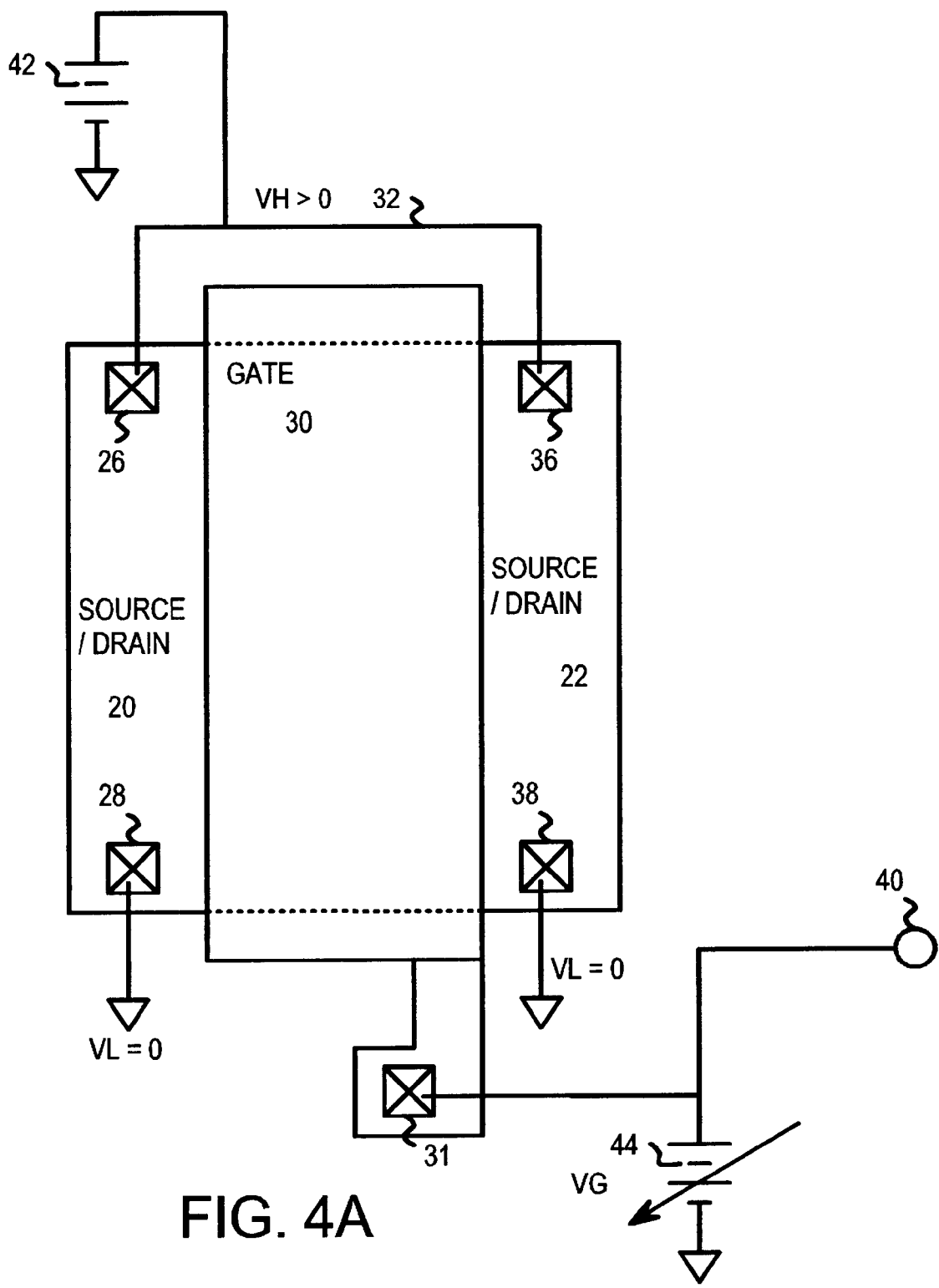
FIG. 4A shows gate biasing of the varactor.

FIG. 4A shows gate biasing of the varactor. In this embodiment, the same physical transistor structure can be used as shown for FIG. 3. Lower contacts 28, 38 of source 20 and drain 22 are grounded, while upper contacts 26, 36 are connected to a constant voltage VH by metal line 32. The constant voltage VH can be generated by an applied voltage from external battery 42, or from a bias-voltage generators such as a voltage divider or band-gap voltage reference.

Gate 30 is biased with an adjustable gate voltage VG through contact 31. Variable voltage source 44 could be a variable-voltage generated from a battery and a variable resistor, or by some other voltage-generating circuit. For example, a digital-to-analog converter (DAC) could receive a binary code and convert it to a variable voltage.

The variable capacitance is provided to another circuit (not shown) by terminal 40. The circuit sees a variable capacitor between terminal 40 and ground. The value of the capacitance is adjusted by varying gate voltage VG.

Figure 4B:
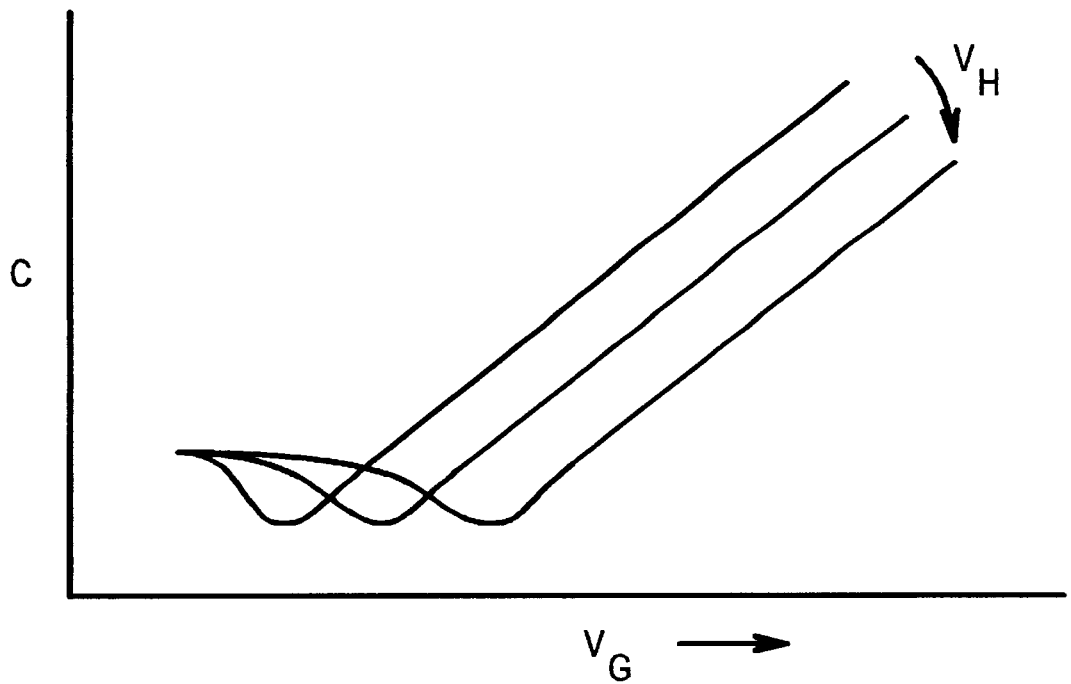
FIG. 4B is a graph showing variation of capacitance with gate voltage.

FIG. 4B is a graph showing variation of capacitance with gate voltage. As the gate voltage VG is raised with the transistor off, the capacitance initially dips as the gate-to-substrate (bulk) capacitance decreases as the weakly accumulated region disappears. t However, as the gate voltage rises above threshold near the lower contact, the inversion region is formed and the capacitance increases. The increase in capacitance is linear with gate voltage above threshold, since more and more of the gate is turned on as the gate-to-source voltages are raised. This capacitance is a gate-to-source and gate-to-drain capacitance that includes part of the channel under the gate. The turned-on lower region 30B is enlarged as the threshold point DY moves upward with the increase in gate voltage.

Higher values of upper-source voltage VH reduce the gate-to-source voltage near the upper contact, and also enlarge the voltage gradient across the source and drain resistors. Thus a smaller turned-on lower region 30B is formed for higher voltages VH, as shown by the lines of varying VH.

Figure 5B:
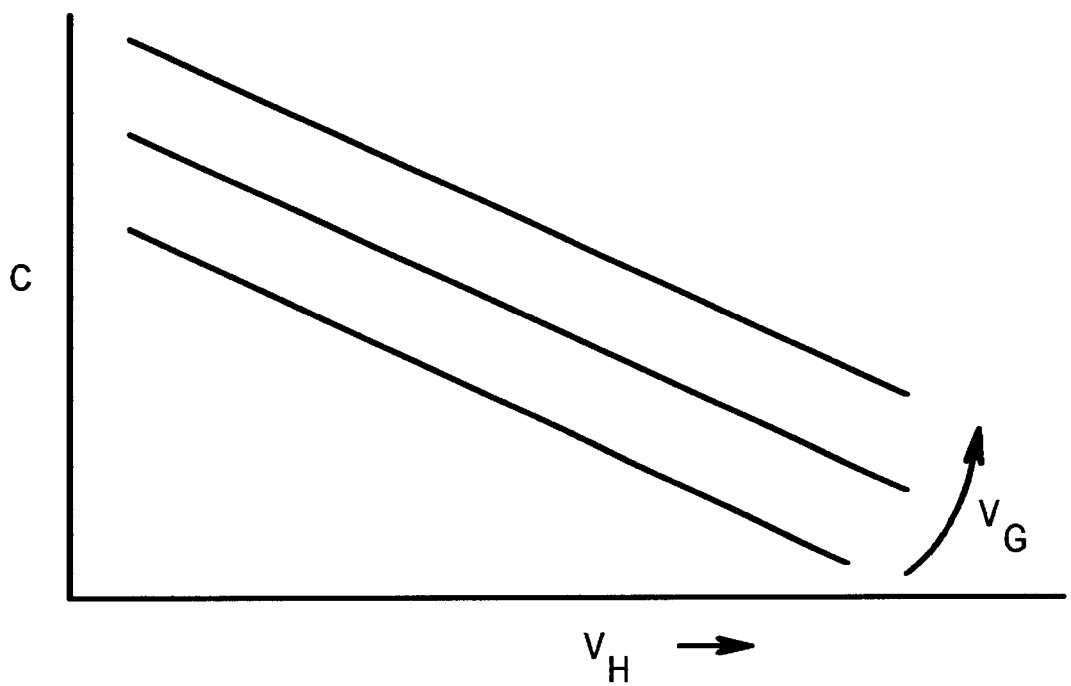
FIG. 5B is a graph showing variation of capacitance with upper-source voltage.
Figure 5A:
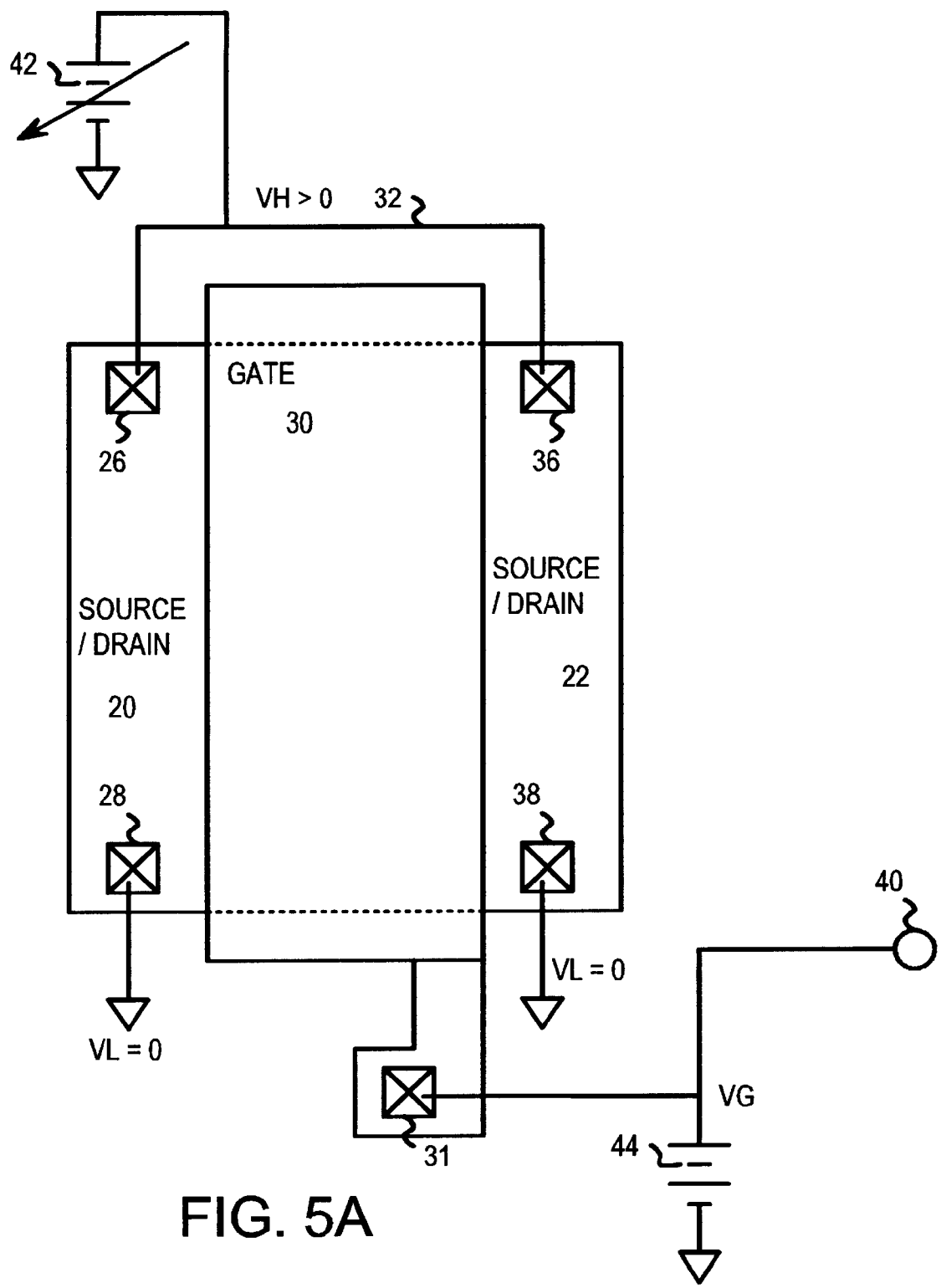
FIG. 5A shows upper-source biasing of the varactor.

FIG. 5A shows upper-source biasing of the varactor. In this embodiment, the same physical transistor structure can be used as shown for FIG. 3. Lower contacts 28, 38 of source 20 and drain 22 are grounded, while upper contacts 26, 36 are connected to a variable voltage VH by metal line 32. The variable voltage VH can be generated by an applied voltage from external battery 42, or other variable-voltage generators or networks.

Gate 30 is biased with an constant gate voltage VG through contact 31. Constant voltage source 44 could be a variable-voltage generated from a battery or from a bias-voltage generator such as a voltage divider or band-gap voltage reference.

The variable capacitance is provided to another circuit (not shown) by terminal 40. The circuit sees a variable capacitor between terminal 40 and ground. The value of the capacitance is adjusted by varying upper-source voltage VH. Since VH is separate from VG, the capacitance voltage control is isolated from the capacitance output node terminal 40. This biasing embodiment benefits from less capacitance variation with operating conditions of the circuit using the variable capacitor, since a separate voltage VH is varied to adjust the capacitance.

FIG. 5B is a graph showing variation of capacitance with upper-source voltage. As upper-source voltage VH is raised, the area of the turned-on lower region 30B is reduced, reducing capacitance. Higher gate voltages increase the gate-to-source voltages uniformly across all values of Y for the source, so parallel lines are shown with higher capacitance for larger values of VG.

As the graphs show, capacitance changes with applied voltage in a controlled, monotonic manner over most of the voltage range. The slope (dC/dV) is mostly constant, allowing for predictable capacitance adjustments without complex calculations.

Figure 6:
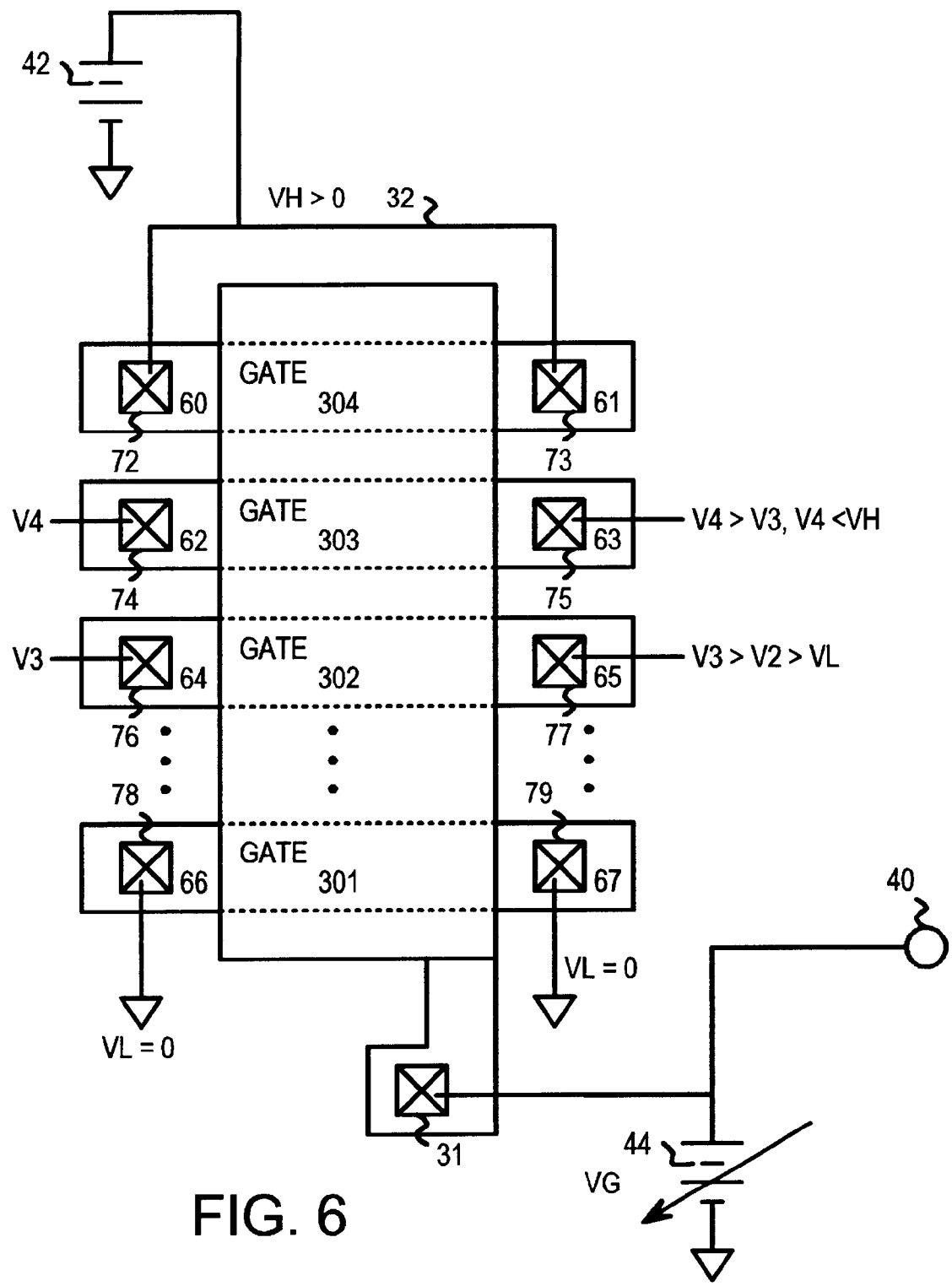
FIG. 6 is a zero-current embodiment of the voltage-variable capacitor.

Zero-Current Capacitor—FIG. 6

FIG. 6 is a zero-current embodiment of the voltage-variable capacitor. A disadvantage of the embodiments of FIGS. 3–5 is that current flows from line 32 to line 34 through the resistor of source 20, and through the resistor of drain 22. For example, a 100-ohm source resistance draws a current of 10 mA when VH is 1 volt. The current can be reduced by using a longer, narrower source and drain. A 3 by 300 micron source has 100 squares, or 2K-ohm resistance. A VH of 1 volt then draws only 0.5 mA per source/drain, or a total of 1 mA. Thus the current through the source/drain can be reduced by layout.

The source/drain current can be eliminated by dividing the source and drain into several silicon islands separated by field oxide. The source is divided into separate source islands 60, 62, 64, 66, each having a contact 72, 74, 76, 78 to a different bias voltage. Likewise, the drain is also divided into separate drain islands 61, 63, 65, 67, each containing a contract 73, 75, 77, 79 to the different bias voltages.

Each opposing source island and drain island are formed in the same thin-oxide or diffusion area as the gate region between the source and drain islands. For example, source island 60, drain island 61, and gate region 304 are formed in the same rectangle of thin oxide defined by the field-oxide or diffusion mask step. Likewise, source island 62, drain island 63, and gate region 303 are formed within another rectangle of the diffusion mask. This second rectangle is separated from the first rectangle by thick field oxide or another insulator that separates transistors from each other. The thick field oxide is also formed under the polysilicon gate material that connects gate regions 304 and 303.

All gate regions 304, 303, 302, 301 can be formed from the same polysilicon or other gate material and are connected to a metal line by contact 31, which is over field oxide. Variable voltage source 44 is applied to contact 31 to adjust the D.C. gate bias voltage VG. Capacitor terminal 40 is also connected to gate contact 31 and may have an A.C voltage variation.

Each of the opposing source and drain islands has a bias voltage applied. The bias voltages are stepped in increments between the lower source-bias voltage VL and the upper source-bias voltage VH. Upper source island 60 and upper drain island 61 are connected to metal line 32 by contacts 72, 73. Upper voltage source or external battery 42 biases upper source island 60 and upper drain island 61 to upper bias voltage VH. Lower source island 66 and lower drain island 67 are grounded by contacts 78, 79. The physical layout ordering of the islands does not have to follow the bias order. The islands can be arranged in any order, including random.

Intermediate source and drain islands are biased to intermediate voltages V1, V2, V3, V4 . . . These intermediate voltages can be in equal steps or divisions of the overall voltage difference VH–VL. For an example with 4 intermediate voltages V1–V4 (six source islands including the upper and lower islands) there are 5 increments. Each increment can be one-fifth of VH–VL. For example, when VH is 2.0 volts and VL is 0 volts, V1 is 0.4 volt, V2 is 0.8 volt, V3 is 1.2 volt, and V4 is 1.6 volt.

A voltage divider with many outputs, or other voltage generator could be used to generate the intermediate voltages from VH and VL. While the voltage divider might draw some current, it can be designed to minimize current while still generating the intermediate voltages. Since each island is separated from adjacent islands by insulating field oxide, there is no D.C. current path from VH to VL through the source or drain. Each island is biased to a static voltage with little or no current loss.

Non-equal increments could also be substituted to vary the slope of the dC/dV curve, and the width of each island could be varied, as could the number of islands. Many more islands could be used for smother capacitance adjustments.

The capacitance seen at terminal 40 is adjusted by adjusting the gate bias VG. Increasing VG increases the gate-to-source voltage for all islands, causing more islands to exceed the transistor threshold and turn on. With more of the islands turned on with a conducting channel under their gate regions, the overall capacitance of the variable capacitor increases with gate voltage VG.

The capacitance increases in discrete steps as the gate voltage is increased more than a threshold above the source voltage of the next island, turning its channel on. The dC/dV curve shows steps rather than a smooth curve. This can be an advantage for some applications. For example, the circuit attached to terminal 40 may have an A.C. component that is applied to terminal 40. This A.C component can add voltage variations to gate voltage VG. If these variations are less than the voltage required to turn on the next island, or turn off the uppermost island that is on, then the A.C. variations do not change the capacitance. For the embodiment of FIG. 4A, these small A.C. variations do change the capacitance as the size of the channel is varied by the A.C. variations. Thus using discrete capacitance steps provides a more stable capacitance that is still adjustable.

Figure 7:
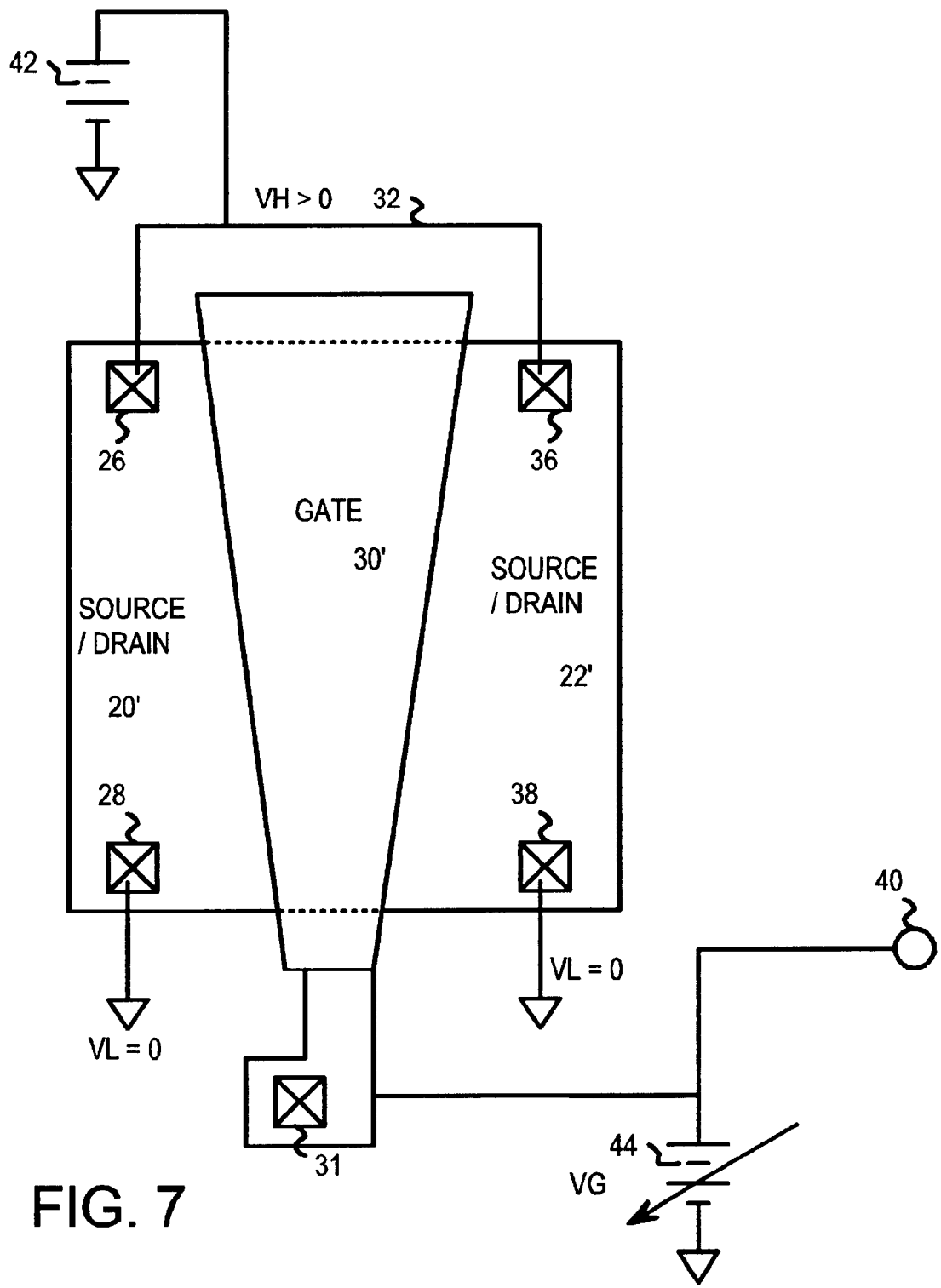
FIG. 7 is an embodiment of the variable capacitor with a trapezoidal gate.

Trapezoidal-Gate Variable Capacitor—FIG. 7

FIG. 7 is an embodiment of the variable capacitor with a trapezoidal gate. Rather than use a rectangular gate, the gate can have other shapes. One useful shape is a trapezoid. Gate 30' has a greater length L near upper contacts 26, 36 than near lower contacts 28, 38. The longer gate has a larger capacitance than the narrower gate.

When the edge of the conducting channel is near upper contacts 26, 36, further increases in gate voltage have a greater increase in the area of the conducting region. However, when the edge of the conducting channel is near the lower contacts 28, 38, changes in gate voltage produce a relatively smaller increase in the size of the channel, due to the narrower channel length.

Thus as gate voltage VG is increased, and the conducting channel region expands from near lower contacts 28, 38 upward to upper contacts 26, 36, each increment of gate voltage dVG produces larger and larger increases in the area of the conducting channel, due to the larger channel length L. The capacitance of a newly turned-on segment is proportional to dW*L(Y), where dW is the additional channel width and L(Y) is the channel length for that value of Y.

Using the trapezoid gate, capacitance increases proportionally to the square of applied bias voltage. This gives a nearly straight linear relationship between applied bias voltage and frequency, which is especially useful when the variable capacitor is used in a frequency tuning circuit.

Source 20' and drain 22' can have the angled shape shown, which reduces the source/drain resistance. This can be undesirable, since source/drain resistor current is increased. The shape of source 20' and drain 22' can also be adjusted to maintain a constant spacing from the gate edge. Then source 20' has the shape of a parallelogram with the long edge parallel to the gate edge. Other shapes can be used as well.

Figure 8:
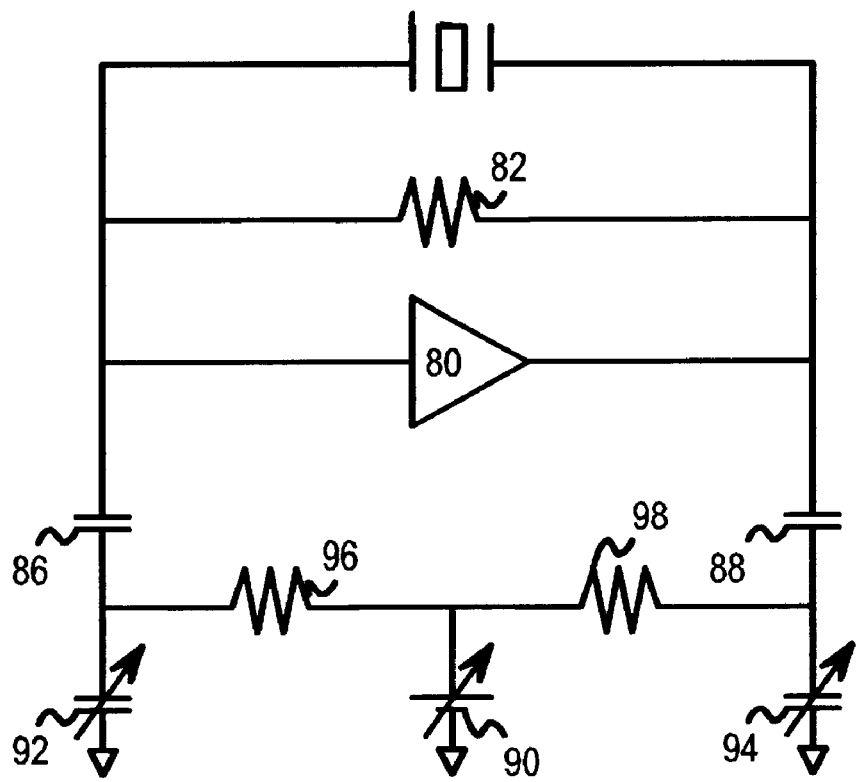
FIG. 8 shows the use of the variable capacitor in a voltage-controlled crystal oscillator circuit.
Figure 9:
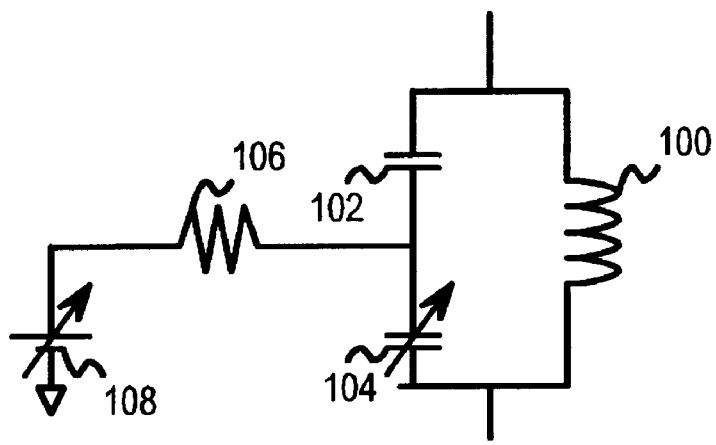
FIG. 9 shows the use of the variable capacitor in a L-C tuning or tank circuit.

Use of Varactor in Circuits—FIGS. 8, 9

FIG. 8 shows the use of the variable capacitor in a voltage-controlled crystal oscillator circuit. Crystal 84 oscillates at a certain frequency. Amplifier 80 and resistor 82 provide feedback across the terminals of crystal 84 to induce oscillation. Battery 90 or another voltage source provides a bias voltage to variable capacitors 92, 94 through resistors 96, 98, respectively. The bias from battery 90 can be adjusted to vary the bias applied to variable capacitors 92, 94, thus adjusting their capacitances. Fixed capacitors 86, 88 couple variable capacitors 92, 94 to the terminals of crystal 84. This embodiment shows a common Pierce series crystal oscillator. Feedback resistor 82 keeps amplifier 80 in a high gain region. Amplifier 80 provides sufficient gain while the two capacitors 92 and 94 together with amplifier 80 shift phase enough to get positive feedback through crystal. When the values of variable capacitors 92 and 94 change, the phase shift due to these changes causes the crystal to change the frequency to match the phase shift, producing positive feedback.

Variable capacitors 92, 94 can be the embodiment shown in FIG. 4A, where the gate voltage bias is adjusted to adjust the capacitance. The terminals of the variable capacitor are ground and the gate node. The gate node of each variable capacitor 92, 94 is connected to the adjustable gate bias of battery 90 through resistors 96, 98. The capacitance of variable capacitor 92 in series with capacitor 96 is thus adjusted by battery 90. Likewise, the capacitance of variable capacitor 94 in series with capacitor 98 is also adjusted by battery 90.

FIG. 9 shows the use of the variable capacitor in a L-C tuning or tank circuit. Inductor 100 is in parallel with a series capacitance of fixed capacitor 102 and variable capacitor 104. The resonant frequency across inductor 100 is tunable by adjusting the capacitance of variable capacitor 104.

Adjustable voltage source 108 applies a bias voltage to variable capacitor 104 through resistor 106. This bias voltage adjusts the capacitance of variable capacitor 104. Variable capacitor 104 can be the variable capacitor shown in FIG. 4A, where the upper terminal of the capacitor and the adjustable bias voltage are both applied to the gate.

The embodiment of FIG. 5A can also be substituted for variable capacitor 104. Then the gate terminal of the variable capacitor is connected to capacitor 102. Resistor 106 does not connect to capacitor 102, but instead connects to the upper-source terminal of the variable capacitor as adjustable voltage VH.

Alternate Embodiments

Several other embodiments are contemplated by the inventors. The terms source and drain are often used interchangeably, as a source/drain region can function as a source or a drain depending on the applied bias voltages. The source and drain regions do not have to have identical layouts or identical voltages.

The drain can be biased to different voltages, although some current can flow from drain to source when the source and drain voltages are not equal. The entire drain could be biased to a fixed voltage while the source is connected to two or more voltages. For example, both the upper and lower drain contracts could be coupled to the upper voltage, while the upper source contact is connected to the upper voltage and the lower source contact connected to the lower voltage.

Many second-order effects can be taken into account using computer simulations, such as a variation of threshold Vth with source voltage (body effect), sub-threshold channel capacitance near Vth, current crowding around the edges of the source and drain regions, and contact placement and capacitance at the ends of the source/drain beyond the contacts. The exact capacitance values can also be determined empirically by simply building one or more varactors, perhaps with different geometries, and measuring its capacitance for various biasing conditions. The source and drain resistance drop when the transistor channel turns on. Conduction can occur in the channel as well as in the source diffusion. The added channel area acts to effectively widen the source where the channel is on. This effective widening of the source decreases its resistance, thus increasing source current.

Lower voltage VL can be raised above ground, reducing the gate-to-source voltages and reducing the capacitance. For example, upper voltage VH can be lowered, which enlarges the conducting channel lower region 30B since the source voltages are lowered.

Capacitance between the gate and substrate can also be used as a variable capacitor. The capacitance between the gate and substrate decreases with increasing gate voltage as the inversion layer formed inside the channel shields the substrate from the gate. The maximum available gate-to-substrate capacitance is less than full gate-to-channel capacitance in the operation range.

Other insulators besides field oxide can be used, such as trench isolation or silicon-on-insulator or non-silicon materials. Special processing steps can be eliminated since the variable capacitor is formed using standard transistor processing steps.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but some may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A variable capacitor comprising:

a gate formed over a thin insulator that separates the gate from a substrate;

a source formed in the substrate on a source side of the gate;

an upper-source contact to the source for applying an upper voltage to an upper portion of the source; and a lower-source contact to the source for applying a lower voltage to a lower portion of the source;

wherein the upper voltage is higher than the lower voltage, wherein a gate-to-source voltage varies along a gate-source edge;

wherein a gate bias voltage applied to the gate, the upper voltage and the lower voltage cause a conducting portion of the gate to have a conducting channel formed in the substrate under the conducting portion, and a non-conducting portion of the gate to not have a conducting channel formed in the substrate under the non-conducting portion;

wherein a capacitance per unit area of the conducting portion is higher than a capacitance per unit area of the non-conducting portion;

wherein capacitance of the variable capacitor measured from the gate is adjustable by adjusting a ratio of an area of the conducting portion to the area of the non-conducting portion, whereby capacitance is adjustable by adjusting areas of conducting and non-conducting regions under the gate.

2. The variable capacitor of claim 1 further comprising:

a variable gate-voltage source for adjusting the gate bias voltage applied to the gate to vary capacitance;

wherein increasing the gate bias voltage increases the area of the conducting portion and decreases the area of the non-conducting portion to increase capacitance, whereby capacitance is adjusted by adjusting the gate bias voltage.

3. The variable capacitor of claim 1 further comprising:

a variable upper-voltage source for adjusting the upper voltage applied to the upper-source contact;

wherein increasing the upper voltage decreases the area of the conducting portion and increases the area of the non-conducting portion to increase capacitance, whereby capacitance is adjusted by adjusting the upper voltage applied to the upper portion of the source.

4. The variable capacitor of claim 3 wherein capacitance is substantially linearly proportional to the gate bias voltage and to the upper voltage when both the conducting portion and the non-conducting portion exist under the gate, whereby capacitance varies linearly with applied voltage.

5. The variable capacitor of claim 1 wherein the gate is trapezoidal in shape;

wherein a length of the gate near the upper portion of the source is larger than a length of the gate near the lower portion of the source;

whereby gate length varies.

6. The variable capacitor of claim 1 further comprising:

a drain formed in the substrate on a drain side of the gate;

an upper-drain contact to the source for applying the upper voltage to an upper portion of the drain;

whereby the drain is biased to the upper voltage.

7. The variable capacitor of claim 6 wherein the gate, source, and drain form an n-channel metal-oxide-semiconductor transistor.

8. The variable capacitor of claim 6 further comprising:

a lower-drain contact to the source for applying the lower voltage to a lower portion of the drain;

wherein the upper voltage is higher than the lower voltage, wherein a gate-to-drain voltage varies along a gate-drain edge, whereby a voltage difference is applied across the drain.

9. The variable capacitor of claim 8 wherein a drain current flows from the upper-drain contact to the lower-drain contact.

10. The variable capacitor of claim 1 wherein a source current flows from the upper-source contact to the lower-source contact.

11. The variable capacitor of claim 1 wherein the source comprises a plurality of isolated source islands biased to different voltages between the upper voltage and the lower voltage, the isolated source islands being electrically isolated from one another, wherein source current flow is blocked by the isolated source islands.

12. A varactor comprising: a transistor having a gate, a source, and a drain; wherein the source also comprises a source resistor between an upper-source contact and a lower-source contact; wherein the drain also comprises a drain resistor between an upper-drain contact and a lower-drain contact; an upper voltage applied to the upper-source contact and the upper-drain contact; a lower voltage applied to the lower-source contact and the lower-drain contact; wherein the upper voltage and the lower voltage are not equal, causing a source current to flow through the source resistor, and causing a drain current to flow through the drain resistor; and a gate voltage applied to the gate, the gate voltage sufficient to cause formation of a conducting channel under a first portion of the gate but insufficient to cause formation of a conducting channel under all of the gate; wherein capacitance is varied by enlarging or reducing an area of the first portion.

13. The varactor of claim 12 wherein a gate-to-source voltage near the upper-source contact is less than a threshold voltage, causing no conducting channel to form near the upper-source contact;

wherein a gate-to-source voltage near the lower-source contact is greater than the threshold voltage, causing the conducting channel to form near the lower-source contact, whereby gate-to-source voltages vary along the source, causing the conducting channel to form under part but not all of the gate.

14. The varactor of claim 13 further comprising:

an adjustable bias generator for adjusting the gate voltage applied to the gate;

a constant bias generator for generating the upper voltage;

a ground connection for connecting the lower-source contact and the lower-drain contact to a ground;

wherein the lower voltage is ground, wherein the upper voltage is a constant voltage above ground;

wherein the gate voltage is increased to enlarge the first portion and capacitance but decreased to decrease the first portion and capacitance, whereby capacitance is adjusted by adjusting the gate voltage.

15. The varactor of claim 14 wherein the capacitance is linearly proportional to the gate voltage.

16. The varactor of claim 13 further comprising:

an adjustable bias generator for adjusting the upper voltage applied to the upper-source contact and the upper-drain contact;

a constant bias generator for generating the gate voltage;

a ground connection for connecting the lower-source contact and the lower-drain contact to a ground;

wherein the lower voltage is ground, wherein the gate voltage is a constant voltage above ground;

wherein the upper voltage is decreased to enlarge the first portion and capacitance but increased to decrease the first portion and capacitance, whereby capacitance is adjusted by adjusting the upper voltage.

17. The varactor of claim 16 wherein the capacitance is linearly proportional to the upper voltage.

18. The varactor of claim 12 wherein a first terminal of the varactor is connected to the gate and wherein a second terminal of the varactor is a ground;

wherein the first terminal is connected to a tuning circuit as a variable capacitor between the first terminal and a ground, wherein capacitance of the varactor is voltage adjustable by adjusting the upper voltage.

19. A voltage-controlled variable capacitor comprising:

gate means for applying a gate voltage to a control gate over a substrate, the gate voltage forming a conducting channel in the substrate when the gate voltage exceeds a threshold;

source means, formed adjacent to the gate means in the substrate, for sourcing carriers to the conducting channel;

drain means, formed adjacent to the gate means in the substrate, for draining carriers from the conducting channel; and differential source bias means for applying a voltage gradient across the source means wherein an upper part of the source means has a higher voltage than a lower part of the source means;

wherein the voltage gradient across the source means allows the conducting channel to form under the gate means adjacent to the lower part, but does not allow the conducting channel to form under the gate means adjacent to the upper part, whereby only part of the conducting channel is formed under the gate means.

20. The voltage-controlled variable capacitor of claim 19 further comprising:

variable voltage means for varying the gate voltage to adjust capacitance of the gate means, or for varying the voltage gradient across the source means to adjust capacitance of the gate means.

* * * * *